(12) United States Patent
Goeke et al.

(10) Patent No.: US 9,197,236 B1
(45) Date of Patent: Nov. 24, 2015

(54) DIGITIZER AUTO APERTURE WITH TRIGGER SPACING

(71) Applicant: Keithley Instruments, Inc., Cleveland, OH (US)

(72) Inventors: Wayne C. Goeke, Hudson, OH (US); Brian P. Frackelton, Macedonia, OH (US); Benjamin J. Yurick, Garrettsville, OH (US)

(73) Assignee: TEKTRONIX, INC., Beaverton, OR (US)

( * ) Notice: Subject to any disclaimer, the term of this patent is extended or adjusted under 35 U.S.C. 154(b) by 0 days.

(21) Appl. No.: 14/568,904

(22) Filed: Dec. 12, 2014

Related U.S. Application Data

(60) Provisional application No. 62/079,754, filed on Nov. 14, 2014.

(51) Int. Cl.
*G01R 13/02* (2006.01)
*H03M 1/12* (2006.01)
*H03M 1/06* (2006.01)

(52) U.S. Cl.
CPC .......... *H03M 1/1245* (2013.01); *H03M 1/0634* (2013.01); *G01R 13/0254* (2013.01); *G01R 13/0272* (2013.01)

(58) Field of Classification Search
None
See application file for complete search history.

(56) References Cited

U.S. PATENT DOCUMENTS

| | | | | |
|---|---|---|---|---|
| 4,791,404 A * | 12/1988 | Hollister | ................ | G01R 13/34 324/102 |
| 4,982,193 A * | 1/1991 | Saul | ........................ | H03D 1/22 341/122 |
| 6,486,809 B1 * | 11/2002 | Figoli | ................ | H03M 1/1225 341/141 |
| 8,755,460 B2 * | 6/2014 | Foote | .................. | H03M 1/1245 370/302 |

* cited by examiner

*Primary Examiner* — Howard Williams
(74) *Attorney, Agent, or Firm* — Marger Johnson

(57) ABSTRACT

A method for producing sampled data, which as the requested sampling period is increased, each sample is the average of an increasing number of ADC samples such that a maximum number of ADC samples are evenly space across the sample period. The method can include choosing one of multiple ADC with varying speed versus resolution capabilities to further increase the quality of the sampled data as the sampling period increases.

3 Claims, 3 Drawing Sheets

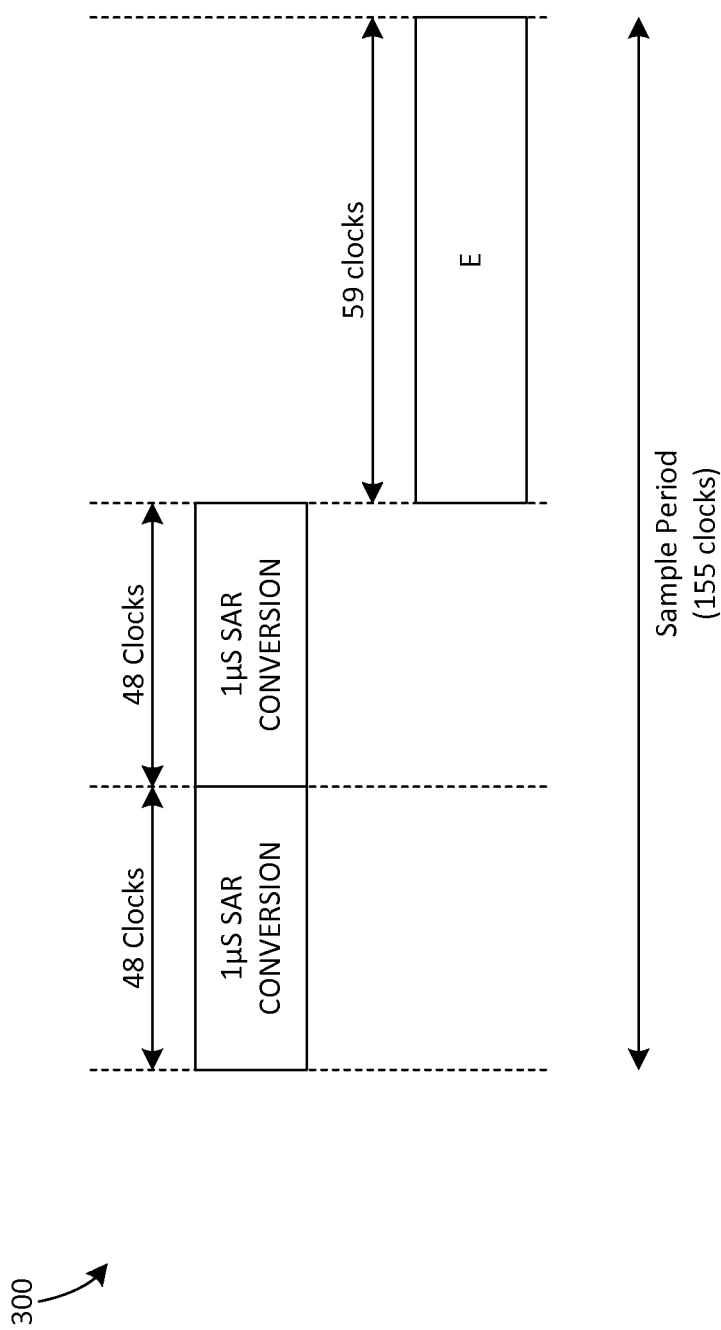

US 9,197,236 B1

DIGITIZER AUTO APERTURE WITH TRIGGER SPACING

CROSS-REFERENCE TO RELATED APPLICATION

This application claims the benefit of U.S. Provisional Patent Application No. 62/079,754, titled DIGITIZER AUTO APERTURE WITH TRIGGERING SPACING and filed on Nov. 14, 2014.

TECHNICAL FIELD

This disclosure relates generally to digitizers, logic analyzers, and other electronic acquisition systems.

BACKGROUND

Logic analyzers generally allow a user to specify a sample rate as an integer multiple of what the hardware can achieve.

Digitizers are similar to logic analyzers and generally allow a user to perform measurements at a specified interval.

Many products currently offer filtering of measurements where the user can specify a filter size or where measured data is filtered behind the scenes.

Certain digital multi-meters (DMMs), such as the 2001 DMM by Keithley Instruments, offers an "auto aperture" feature, but such feature simply involves programming the aperture to get a requested resolution.

Previous DMMs and other test equipment may allow a user to specify a fixed aperture for the analog-to-digital converter (ADC) to measure the inputs to produce a measurement but do not extend beyond such functionality.

Digitizers and other acquisition systems generally allow a user to set a sample rate, which can be implemented as specified. This may done by definition (i.e., the user may ask for that sample rate). This approach simplifies the implementation since the system doesn't need to deal with any mismatch between the achievable sample rate and what is requested. If the system can acquire data at 1 ns rates, the user may specify the sample rate in 1 ns increments and the sample rate may be so implemented.

Consider an example in which a logic analyzer allows a user to specify a sample rate (e.g., 1 ns in 1 ns increments). Here, the instrument implements exactly what is specified by the user. There is generally too much data in high-speed systems to do much else with it.

Consider another example in which an ADC chip takes a measurement and returns the result as fast as it is triggered. Here, the chip does not attempt to introduce any variable delay behind the scenes as its priority is to output the measurement as soon as possible.

BRIEF DESCRIPTION OF THE DRAWINGS

FIG. 3 illustrates an example of fixed aperture firmware calculations.

DETAILED DESCRIPTION

Figure 1:
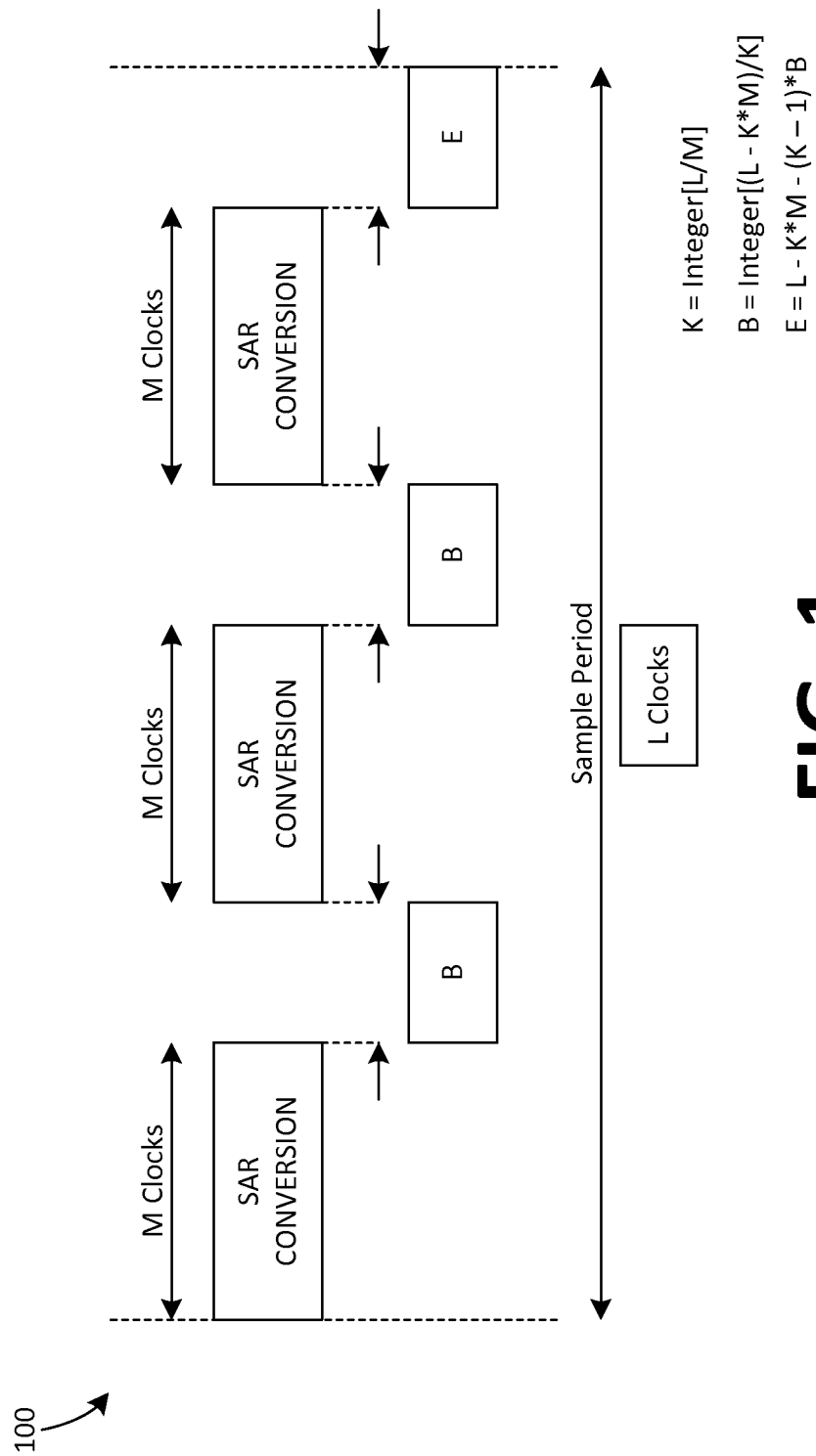
FIG. 1 illustrates an example of firmware registers in accordance with certain implementations of the disclosed technology.

Certain embodiments of the disclosed technology include taking a specified sample rate and producing data at that sample rate (e.g., to the end user) while triggering measurements at another rate behind the scenes to achieve superior accuracy.

In situations where the sample rate is slower than the fastest rate the hardware can support, the system may oversample and take as many samples as possible within the sample period (1/sample-rate). These readings may then be averaged to eliminate noise. Consider an example in which the hardware has a 1M sample/sec ADC. If asked to run at 500 k sample/sec, the algorithm may take 2 measurements behind the scenes and average them. If asked for 100 k samples/second, the algorithm may take and average 10 readings since ten 1 us readings can fit within the 10 us window.

In situations where more than an integer number of samples fit within the sample period, the algorithm may take as many measurements as can fit and equally space them to create a consistent background sample rate.

Consider an example assuming a 1 us ADC conversion rate (i.e., 1M sample/sec) with a user-requested sample rate of 400 kHz. Here, the 2.5 us period can accommodate only 2 full readings. The algorithm may split up the extra 0.5 seconds so that measurements are periodically triggered every 1.25 us (i.e., completely filling the 2.5 us period) and each 2 measurements may be averaged to yield 1 result to the end user.

FIG. 1 illustrates an example of firmware registers 100 in accordance with certain implementations of the disclosed technology, where L refers to the number of clocks per sample period, K refers to the number of sub-measurements to be averaged, B refers to the number of clocks between the sub-measurements, and E refers to the number of clocks after the final sub-measurement. In the example, the number of sub-measurements (i.e., K) is three.

Figure 2:
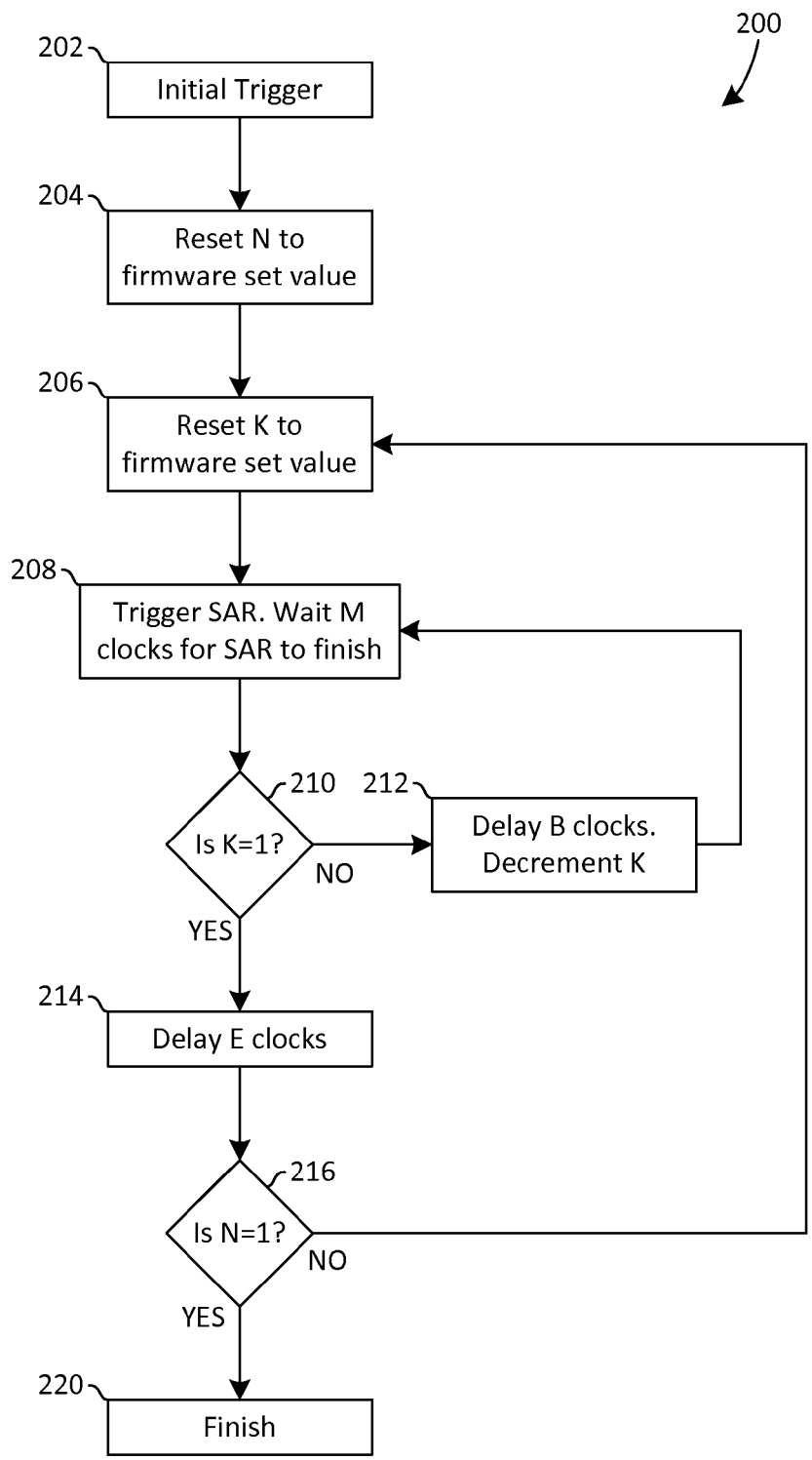
FIG. 2 illustrates an example of a field-programmable gate array (FPGA) state machine in accordance with certain implementations of the disclosed technology.

FIG. 2 is a flow chart illustrating an example of a method 200 in accordance with certain implementations of the disclosed technology.

After an initial trigger at 202, the number of measurements N is reset to its firmware set value, as indicated by 204. The number of sub-measurements K is then reset to its calculated set value, as indicated by 206. The SAR is then triggered and an M-clock pause is implemented to allow the SAR to finish, as indicated by 208.

At 210, a determination is made as to whether K is equal to one: if not, a delay of B clocks is implemented and K is decremented (as indicated by 212) and then the method returns to 208; otherwise, a delay of E clocks is implemented (as indicated at 214).

At 216, a determination is made as to whether N is equal to one: if not, a delay of B clocks is implemented and K is decremented (as indicated by 218) and then the method returns to 206; otherwise, the process 200 completes, as indicated by 220.

Certain implementations of the disclosed technology may allow a user to disable the "auto" aperture feature. For example, the subsampling and averaging behind the scenes may be problematic if the application does not want to monitor the input signal between sample points. In such situations, the system may allow a user to program a fixed aperture, such as the fixed aperture firmware calculations 300 illustrated by FIG. 3.

Certain implementations may include intelligence to select from more than one ADC to use given a specified sample rate (e.g., switch from a successive-approximation-register (SAR) ADC to a charge balance ADC). The resulting time/accuracy tradeoff with the ADC may allow for increased performance until it reaches a point of diminishing returns, at which point the system can switch to use another ADC technology and automatically pick that for the user at the appropriate point.

Consider a first example in which a product has two ADCs: a SAR ADC with maximum accuracy of 18 bits (i.e., before averaging) and maximum speed of 1M readings/sec; and a charge balance ADC with maximum accuracy of around 26 bits and maximum speed of around 20 k readings/sec (e.g., 0.0005 NPLC aperture with rundown overhead). If a user chooses a sample rate that both ADCs can support, the firmware may use a performance table to decide which will yield better results. Since the system is generally averaging to extend the accuracy of the SAR ADC, it can achieve some overlap where the faster SAR may still outperform the slower charge balance ADC at very high sample rates (i.e., very small apertures).

The "auto" aperture approach described herein generally allows the user to achieve superior results without having to think about it.

Certain implementations of the disclosed technology may include an algorithm configured to help bridge the gap between a fast but less accurate ADC and a slower but more accurate ADC. The extra averaging advantageously extends the usability of the faster ADC and makes it possible to create overlap between ADC technologies so that they can be chosen for the user based upon the specified settings.

The following discussion is intended to provide a brief, general description of a suitable machine in which embodiments of the disclosed technology can be implemented. As used herein, the term "machine" is intended to broadly encompass a single machine or a system of communicatively coupled machines or devices operating together. Exemplary machines may include computing devices such as personal computers, workstations, servers, portable computers, handheld devices, tablet devices, and the like.

Typically, a machine includes a system bus to which processors, memory such as random access memory (RAM), read-only memory (ROM), and other state-preserving medium, storage devices, a video interface, and input/output interface ports can be attached. The machine may also include embedded controllers such as programmable or non-programmable logic devices or arrays, Application Specific Integrated Circuits (ASICs), embedded computers, smart cards, and the like. The machine may be controlled, at least in part, by input from conventional input devices such as keyboards and mice, as well as by directives received from another machine, interaction with a virtual reality (VR) environment, biometric feedback, or other pertinent input.

The machine may utilize one or more connections to one or more remote machines, such as through a network interface, modem, or other communicative coupling. Machines can be interconnected by way of a physical and/or logical network, such as an intranet, the Internet, local area networks, wide area networks, etc. One having ordinary skill in the art will appreciate that network communication may utilize various wired and/or wireless short range or long range carriers and protocols, including radio frequency (RF), satellite, microwave, Institute of Electrical and Electronics Engineers (IEEE) 545.11, Bluetooth, optical, infrared, cable, laser, etc.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments that are described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

We claim:

1. A method for producing a plurality of data samples at a predetermined sample period where each data sample represents an average of as many analog-to-digital converter (ADC) samples K that can be taken within the predetermined sample period, the method comprising:
    determining the number of ADC samples averaged (K), wherein K represents an integer truncation of a ratio of the predetermined sample period to a minimum ADC sample period;
    determining the ADC samples period by dividing the predetermined sample period by the number of ADC samples averaged;
    spacing the start each group of K ADC samples by the predetermined sample period; and
    outputting the average of each group of K ADC samples as one of the plurality of data samples.

2. The method of claim 1, wherein there are at least two ADCs having a span of speed versus resolution capability.

3. The method of claim 2, further comprising selecting which of the at least two ADCs to use.

* * * * *